United States Patent [19]

Howard et al.

[11] 4,004,148

[45] Jan. 18, 1977

[54] ACCUMULATION MODE CHARGE INJECTION INFRARED SENSOR

[75] Inventors: Philip E. Howard, N. Syracuse; James C. Kim, Liverpool, both of N.Y.; Hans G. Sippach, Fullerton, Calif.

[73] Assignee: General Electric Company, Syracuse, N.Y.

[22] Filed: Feb. 2, 1976

[21] Appl. No.: 654,512

[52] U.S. Cl. .............................. 250/370; 250/338; 250/349; 357/30

[51] Int. Cl.² ...................... G01J 1/00; G01T 1/22

[58] Field of Search .......... 250/370, 338, 349, 332; 357/24, 30

[56] References Cited

UNITED STATES PATENTS

| | | | |
|---|---|---|---|
| 3,786,263 | 1/1974 | Michon | 357/24 |
| 3,864,722 | 2/1975 | Carnes | 250/370 |
| 3,873,836 | 3/1975 | Greene | 250/370 |
| 3,882,531 | 5/1975 | Michon | 357/24 |
| 3,902,066 | 8/1975 | Roosild | 250/332 |

*Primary Examiner*—Harold A. Dixon
*Attorney, Agent, or Firm*—Richard V. Lang; Carl W. Baker; Frank L. Neuhauser

[57] ABSTRACT

The present invention relates to an accumulation mode charge injection device utilizing the extrinsic photoconductivity of a doped semiconductor material to sense infrared radiation. The device is operated at cryostatic temperatures to preclude thermal ionization of the impurity sites and majority carriers are produced by IR photons interacting with these sites. The device utilizes a metal-oxide-semiconductor structure to accumulate the IR photon induced majority carriers at the semiconductor oxide interface under a first bias condition. When the bias is reversed the accumulated charges are injected into an output electrode. The sensor may be used singly or in arrays of similar sensors.

6 Claims, 11 Drawing Figures

CHARGE ACCUMULATION

STORAGE BIAS REMOVED

CHARGE INJECTION

ACCUMULATION MODE CHARGE INJECTION INFRARED SENSOR

The Government has rights to this invention pursuant to Contract No. F04701-73-C-0407 awarded by the Department of the Air Force.

BACKGROUND OF THE INVENTION

1. Field of the Invention:

The present invention relates to semiconductor infrared sensors, and to radiation sensors using the charge injection principle.

2. Description of the Prior Art:

Extrinsic photoconductivity in silicon doped with group IV or group V impurities has been reported by a variety of workers, one of the earliest references is E. Burstein et al., Phys.Rev.89,331(1953). Extrinsic photoconductivity in germanium doped with various impurities has been reported as early as 1954 by E. Burstein et al., Phys.Rev.93,65(1954) and an extensive article was published by Newman and Tyler in Solid State Physics, V.S. Academic Press 1959.

Radiation sensing devices for use singly or in arrays using metal oxide semiconductors have been described in U.S. Pat. No. 3,786,263, entitled "Method and Apparatus for Sensing Radiation and Providing Electrical Read Out," the invention of Gerald Michon and assigned to the Assignee of the present invention. Related patents are U.S. Pat. No. 3,877,057 of William E. Engeler, U.S. Pat. No. 3,882,531 of Michon et al, and U.S. Pat. No. 3,890,500 of Charles W. Eichelberg et al., all of which are assigned to the Assignee of the present invention. It has also been proposed to apply charge coupled radiation sensor devices to infrared sensing. Such an application is discussed in an article by Andrew J. Steckl, et al., entitled "Application of Charge-Coupled Devices to Infrared Detection and Imaging," appearing in the Proceedings of the IEEE, Vol., 63, No. 1, January 1975, pages 67–74. An accumulation mode charge coupled device is described in an article by Richard D. Nelson, entitled "Accumulation-Mode Charge-Coupled Device," appearing in *Applied Physics Letters*, Vol. 25, No. 10, 15 November 1975, pages 568–570.

SUMMARY OF THE INVENTION

Accordingly, it is an object of the present invention to provide an improved sensor for infrared radiation.

It is a further object of the present invention to provide a novel IR sensor employing charge injection.

Those and other objects of the present invention are achieved in accordance with the present invention in a novel sensor for infrared illumination comprising a semiconductor substrate of doped semiconductor material upon which the IR illumination impinges creating mobile majority carriers and immobile sites of opposite charge, and a thin insulating layer applied to one surface of the substrate. Electrical contacts are applied to the insulating layer and to the remote surface of the substrate. Cryogenic means establish the semiconductor at a temperature providing inadequate thermal energy to ionize the dopant centers. Typically, the substrate contact is IR transparent. A source of bidirectional pulses is provided, coupled to the contacts. The first polarity is for accumulating mobile photon induced majority carriers at the oxide-semiconductor interface, while the reverse polarity is for injecting charges stored at the oxide-semiconductor interface into the second electrical contact. In one form of the invention the semiconductor material is N type, and the majority carriers are electrons.

In accordance with another aspect of the invention, readout of injected current may be provided by a third contact on the same surface as the insulating layer. When the sensor is used in an area array, the third contact bounds the sensor, and precludes interaction between adjacent sensors. When an area array is employed, the contact on the insulating layer is split to permit its use in the two coordinate address of the individual cell.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings in which:

DESCRIPTION OF THE PREFERRED EMBODIMENTS

Figure 1:
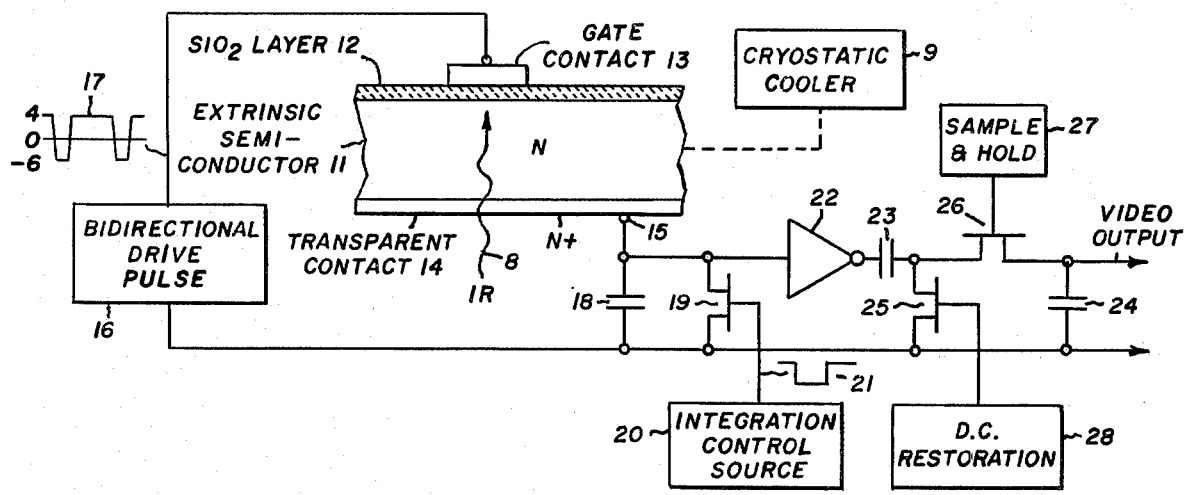
FIG. 1 is an illustration of a novel metal oxide semiconductor IR sensor including the operating circuit. The novel sensor, which is usable as a cell in a linear array has two electrical contacts for the accumulation of photon induced charge carriers.
Figure 3:
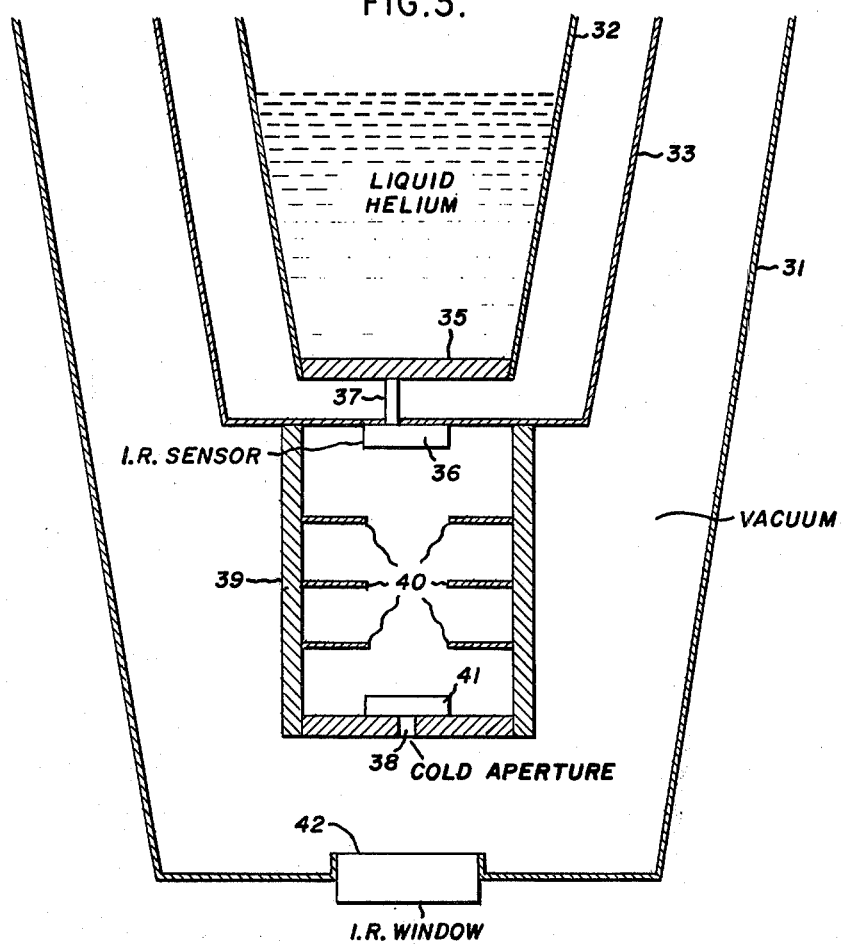
FIG. 3 is a view of the under portion of a cryostat suitable for operation of the IR sensor.

In FIG. 1 there is shown a novel metal-oxide-semiconductor (MOS) IR radiation sensor 10 subjected to a cryogenic environment and connected in an operating circuit. The IR radiation is shown at 8 impinging on the under surface of the sensor. The cryogenic environment is provided by a cryostatic cooler, shown as block 9. The cooler 9 has a heat removal path to the sensor symbolized by the dashed line interconnecting them. The cryostat is best illustrated in FIG. 3. The sensor 10 is shown with broken lateral surfaces to imply that the sensor is a single cell in an array of like cells. The sensors herein disclosed may be used singly, in linear, or in area arrays.

In accordance with the invention, the novel sensor 10 is a charge injection device operating in the accumulation mode. It is shown in FIG. 3 in its simplest, two contact form, suitable for use singly or in a linear array. The sensor is shown in a cross-sectional view in which the thickness dimensions are exaggerated for clarity in illustrating the individual layers. The sensor comprises a substrate 11 of extrinsic n-type semiconductor material; an insulating layer 12 of thermal oxide (SiO$_2$) covering the upper surface of the substrate; a gate contact 13 overlying the SiO$_2$ layer 12; a thin transparent contact 14 of degeneratively doped (N+) material on the under surface of the substrate to which a lead 15 is bonded. The gate contact 13 is connected to one terminal of the source 16 of bidirectional drive pulses. The bidirectional drive pulses are illustrated at 17. The sensor lead 15 is connected to one terminal of an intergrating capacitor 18. The other terminal of capacitor 18 is connected to the other terminal of the pulse source 16 to complete the drive circuit and both terminals are grounded. A MOSFET switch 19 is provided having its source and drain connected across the capacitor 18, and its gate coupled to an integration control pulse source 20. The integration control pulse, shown at 21, controls the MOSFET 19 so as to allow the integrating capacitor 18 to integrate sensor output current or to remain uncharged. The integrated sensor output current may contain the integrated displacement current due to the parasitic capacitance of the sensor as well as current due to injected charges accumulated in the sensor and arising from incident IR illumination.

The integrated sensor output current available at capacitor 18 is coupled to a high gain, high impedance amplifier 22, which amplifies this signal to a power level adequate for further processing and in particular for time sampling to obtain any IR dependent component. This sampling is achieved by a circuit including coupling capacitor 23, which couples the amplified output from amplifier 22 through a series switch 26 to a sample and hold capacitor 24, a shunt d.c. restoration switch 25 for periodically grounding the output of 23, and pulse sources 27, 28, which control sampling and d.c. resration. As will be seen, the sample of the signal is taken after the effect of the parasitic capacity has been removed from the integrated sensor output to obtain a remainder equal to the IR dependent component. The sampled "video" output waveform appears across capacitor 24, and takes the form of a series of unidirectional variable amplitude pulses.

Figure 2:
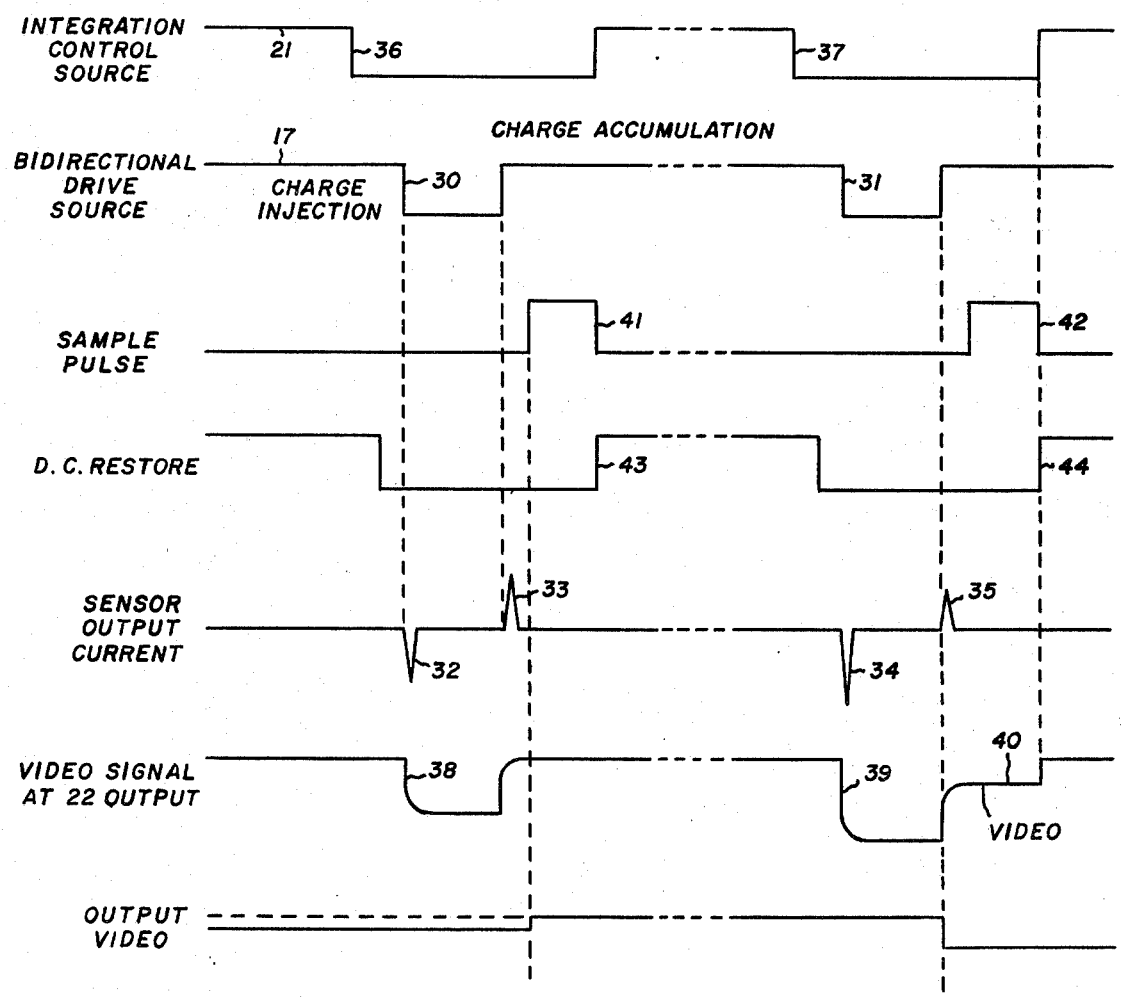
FIG. 2 contains the electrical waveforms applied to and derived from the sensor of FIG. 1 in the IR sensing process.

The operation of the sensor and the isolation of the IR dependent component from the sensor output current may best be understood by reference to the waveforms of FIG. 2. These waveforms (of which there are seven) are plotted against a common time scale with and without IR illumination. The waveforms at the left in FIG. 2 are for no IR illumination present, while those to the right are with IR illumination present. The integration control pulse is the uppermost waveform. Immediately below it is the bidirectional drive pulse 17. The drive pulse entails a series 30, 31 of negative going, nearly rectangular pulses, which start from +4 volts, go steeply to −6 volts, hold at −6 volts for a brief period, and then return to +4 volts. (The voltage levels depend on the type of dopant and density). The duration of the drive pulse is of several microseconds with a relatively small duty cycle.

The output current of the sensor 10 before and after integration by capacitor 18 are respectively the fifth and sixth waveforms from the top in FIG. 2. The non-integrated output current consists of a series of pairs of spikes of mutually opposite polarity. The pair 32, 33 to the left show the sensor output current under the condition of no IR illumination. Under no IR illumination, the sensor operates as a simple capacitor with no net charge after the drive pulse has ended. The "parasitic" capacitance of the sensor appears between the contacts 13 and 15, and the dielectric consists of the oxide layer and substrate in series, both acting as insulators. Thus, when the drive pulse 30 goes negative, a negative going differentiated spike 32 occurs simultaneously in the output current waveform of the sensor. When the drive pulse 30 goes positive, a positive going differentiated spike 33 occurs simultaneously in the output current waveform of the sensor. Both the negative and positive going spikes have substantially equal areas and amplitudes in the non-illuminated state. The integrated waveform at capacitor 18 is shown immediately below the non-integrated sensor waveform in FIG. 2. The integrated output immediately assumes a fixed negative value upon the occurrence of the negative going spike 32. This value is held until the positive going spike 33. When both spikes are integrated by capacitor 18, due to their equality, no net charge is produced, and the capacitor returns to its prior substantially zero volts condition. The video output, which is sampled after this point, as will be described, is also zero.

When the sensor is subjected to IR illumination, however, the unequal pair of spikes 34, 35 at the right side of the sensor current waveform are produced and the integrated sensor output reflects the difference. In particular, the negative going spike 34 at the negative going leading edge of the drive pulse 31 is of increased amplitude and area over the other spikes, and the increase in size of the spike 34 is in proportion to the amount of IR illumination. This increase in spike size, as will be explained, is due to the IR induced charges previously accumulated at the oxide semiconductor interface of the sensor, and now injected into the contact 14, and coupled to integrating capacitor 18. The positive going spike 35, which occurs at the positive going trailing edge of the drive pulse is equal to the area and magnitude of the spikes 32 and 33 occuring in a non-illuminated condition. The positive going pulse 35, as in the non-illuminated condition, corresponds to a reversal in the charge of the parasitic capacity of the sensor. Because under illuminated condition, the negative going spike 34 is of greater area than the positive going spike 35, a net negative current flow takes place.

The integrated sensor current for the illuminated condition is illustrated in curves 39, 40 of FIG. 2. The integrated current, as in the non-illuminated condition, quickly assumes an amplitude set by the negative going spike 34. Since spike 34, at which IR induced current injection occurs, is larger than before, the integrated current pulse is also larger than before, as shown at 39. The pulse 39 continues at a fixed voltage until the end of the drive pulse 31. At the end of the drive pulse 31, the "parasitic" capacity of the sensor is discharged creating the positive going spike 35. The current spike 35 causes a steep drop in the integrated sensor output current to a non-zero value. The integrated voltage falls through a range equal to the amplitude of the pulse 38 (typically 3 volts) and the back porch 40 that remains differs from zero conditions by 1 volt or less. If this back porch is sampled, one may obtain a measure of the IR induced current, accumulated in the sensor and then injected into the capacitor 18.

The sample and hold circuit samples this "back porch" and the charge on capacitor 18 is then released preparatory to taking the next IR reading. A summary of the operation including the sample and hold circuitry is as follows. The negative going integration control pulse (36, 37) opens switch 19, allowing capacitor 18 to float, and thus integrate any charge from the sensor 10. A brief instant after the integration control pulse (36, 37) starts, the bidirectional drive pulse occurs. The drive pulse, which is negative (−6 volts), creates a field across the substrate which is strong enough to drive out charge previously accumulated at the oxide-semiconductor interface as a result of IR illumination. This process is called injection. The injected charge, including parasitic charge, is applied to capacitor 18. The end of the injection pulse reverses the field and attracts a new parasitic charge, allowing one to take away from the total charge on capacitor 18, the amount due to parasitic capacity. The remainder or back porch 40 is thus equal to the IR induced injected charges. The voltage 40 appears for a brief time at the input to amplifier 22, which couples it to capacitor 23. Sampling switch 26, now made conductive, couples the signal from capacitor 23 to the sample and hold capacitor 24. Switch 26 is turned on by pulses 41, 42, which occur just after the injection pulse has terminated. A moment later, the integration period terminates, with switch 19 becoming conducting, shorting capacitor 18. Simultaneously, the sampling period terminates, opening sample and hold switch 26, and the d.c. restoration switch 25 becomes conductive, controlled by pulses 43, 44, discharging capacitor 23.

In a practical embodiment, the sensor substrate is from .004 to .020 inches in thickness and may be constituted of silicon or germanium. In silicon, typical dopants are bismuth, or aluminum, gallium or arsenic introduced to an impurity level of from $5 \times 10^{16}$ to $4 \times 10^{17}$ atoms per cc. A compensating or counter dopant is also added to a level of less than $10^{14}$ atoms per cc (typically $5 \times 10^{13}$). The thermal oxide layer 12 is from 1000A to 2000A in thickness. The gate metallization 13 is from 1 to 1½ microns in thickness. It may be of molybdenum, gold or aluminum and it is vapor deposited on the insulating layer 12. The sensor may be of square outline with dimensions of $0.001 \times 0.001$ inches or larger. The underlying N+ contact layer 14 is produced by a concentrated short term predeposition of phosphorous. The nominal depth is less than 1,000A.

FIG. 3 illustrates the under portion of a cryostat suitable for the IR sensor. A three wall metal Dewar flask using boiling liquid helium as the coolant and having a nominal temperature of 5° Kelvin is shown. As will be explained, dependent on the sensor design, the desired operating temperature may fall in the range of from 5° to 50° K. The first wall of the flask is the outer wall 31, which defines the outer pressure barrier between the outside air at atmospheric pressure and the evacuated interior of the flask. The second wall is an interior wall 32 into which the liquid helium is poured and which is a re-entrant inner pressure barrier between the free boiling helium, normally at atmospheric pressure and the evacuated interior of the flask. The third wall is an intermediate wall 33 situated within the evacuated interior of the flask which acts as a radiation shield between the outer 31 and inner 32 walls. The bottom 35 of the inner wall is designed to provide good thermal contact to the liquid helium and good contact to the IR sensor, shown at 36, by means of a "cold finger" 37 in contact with both. The radiation shield 33 surrounds the IR detector 36 except where it is penetrated by the "cold aperture" shown at 38. The aperture 38 is located at the end of a necked extension 39 of the radiation shield 33 containing one or more radiation baffles 40. The cold aperture 38 provides the opening of the radiation shield through which IR radiation is admitted for impingement on the IR detector 36. A filter 41 may be provided across the aperture 38 to eliminate radiation of unwanted wavelengths. At the bottom of the outer pressure wall 31 an infrared window 42 is provided in alignment with the "cold aperture" in the radiation shield. The window is of an IR transmissive material such as IRtran (Kodak Company) and is of a construction suitable for withstanding atmospheric pressure. The foregoing apparatus with known coolants and/or heat sources may be used to provide ambient temperatures from 5° to 50° K as required for the sensors herein disclosed.

Figure 4A:
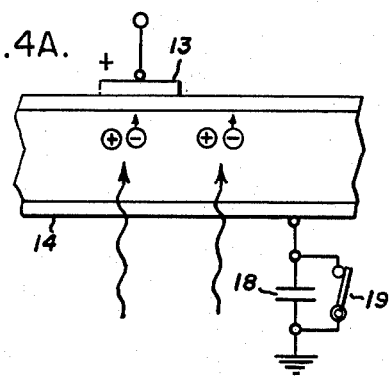
FIGS. 4a, 4b and 4c illustrate the operating sequence of the IR sensor including interaction with IR illumination creating mobile and immobile charges, charge accumulation and charge injection.
Figure 4B:
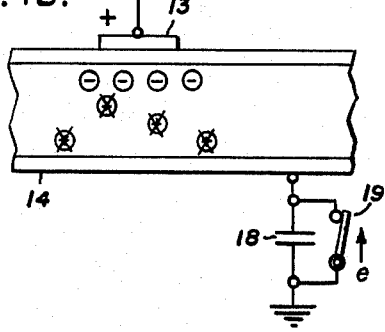
Figure 4C:
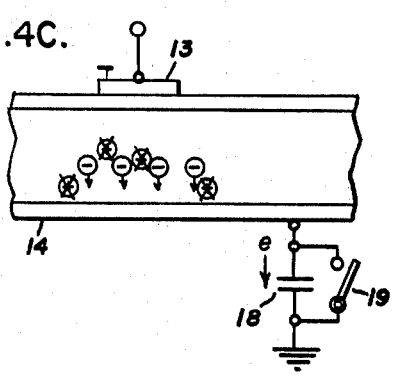
Figure 5A:
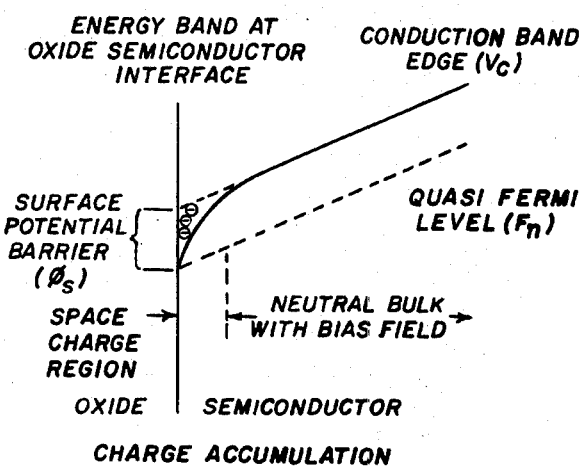
FIGS. 5a, 5b and 5c are energy band diagrams applicable respectively to charge accumulation, a hypothetical condition with no external bias, and charge injection.
Figure 5B:
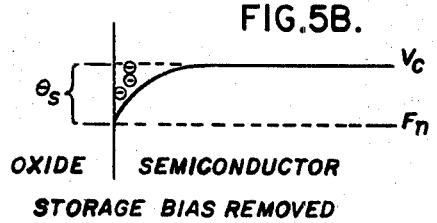
Figure 5C:
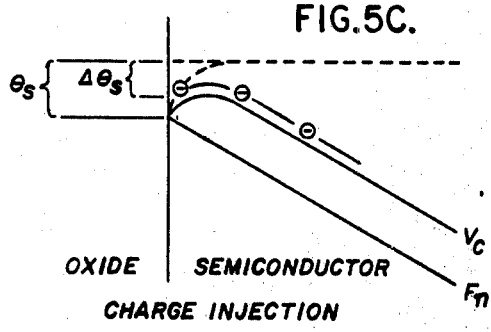

The internal operation of the IR sensor device as an accumulation mode charge injection device may best be understood by reference to FIGS. 4a, 4b, 4c and 5a, 5b and 5c. FIGS. 4a, 4b and 4c illustrate the physical distribution of charge within the sensor. FIGS. 5a, 5b and 5c are energy band diagrams illustrating the energy conditions of the oxide semiconductor interface at different d.c. bias conditions.

In FIGS. 4a, 4b and 4c the sensor 10 is assumed to be at a suitably low cryogenic temperature as required for normal operation to preclude thermal ionization except for those which are IR induced. In FIG. 4a, the sensor is shown at the beginning of the charge integration time in which mobile electrons and immobile positive charge (ionized donor sites) are generated by the incident IR photons. Since the bidirectional pulse source 16 is in a positive output state, i.e., applying a positive potential to the ggate contact 13, the mobile electrons are collected at the interface of the gate 13. The electrons are accumulated at the contact 13, while the immobile positive charge attracts electrons from the outside source 16 through the switch 19 which remains closed briefly. The positive donor sites are then neutralized by recombination with the electrons from the contact 14. At the end of the charge integration period, the total charge (electrons) is accumulated at the contact 13, as shown in FIG. 4b; and the ionized positive charge is neutralized. Just prior to charge injection, the switch 19 is opened. Then the negative charge injection pulse is applied to the gate contact 13. This expels the stored electrons toward the contact 14, charging the capacitance 18, as shown in FIG. 4c. The capacitance 18 receives a negative charge in proportion to the number of electrons "accumulated" and "injected" by the sensor. The current injection pulse from source 16 is selected to provide sufficient energy to inject the stored charges into the capacitor 18. Once the capacitor 18 has received the injected charge, it integrates the charge, producing the waveforms illustrated in FIG. 2. The process then repeats.

The energy band picture, with reference to the drive pulse, is shown in FIGS. 5a, 5b and 5c. At 5a, charges are being accumulated at the oxide semiconductor interface. The positive condition of the drive pulse tilts the energy diagram up to the right, attracting any free electrons to the oxide semiconductor interface and increasing the energy required to free electrons from the interface. Should the drive pulse terminate and go to zero as hypothesized in FIG. 5b, the electrons would still be trapped. If however, the drive pulse is made negative, as shown in FIG. 5c, then the potential barrier is largely removed, and electrons are thereupon injected into the external circuitry.

Figure 6:
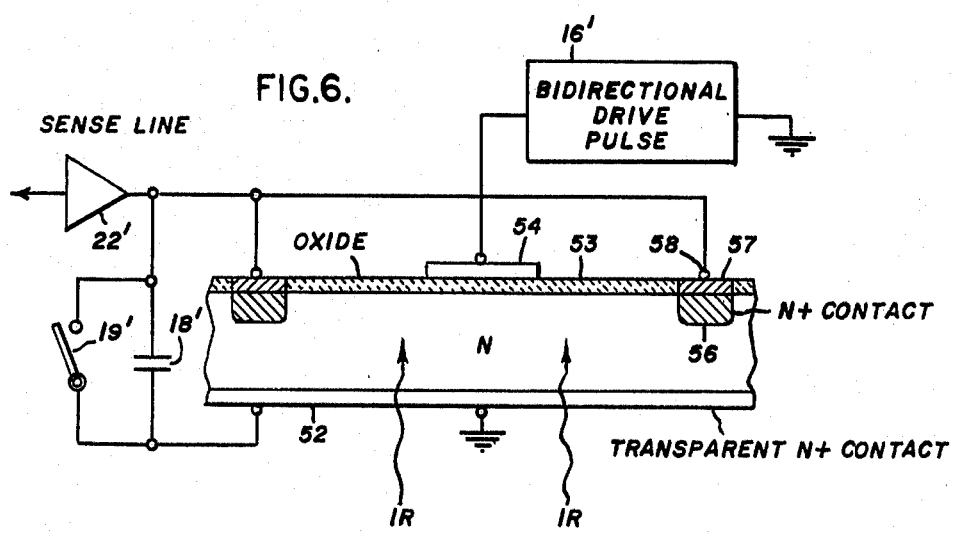
FIG. 6 illustrates a second embodiment of the invention in which the IR sensor is intended as a cell in a linear array and has a separate peripheral contact for cell isolation and charge injection.

The charge injection accumulation mode IR sensor illustrated in FIG. 1 and generally discussed in the prior figures may take other forms. One such alternative form is illustrated in FIG. 6 in which a third electrode is provided on the same face of the semiconductor as the oxide layer. The sensor construction is generally similar to that in the FIG. 1 arrangement with the lowermost contact 52 being a transparent N+ contact on the undersurface of an N doped semiconductor body and a thin oxide layer 53 being provided on the upper surface. A second sensor contact 54 is provided on the top and center of the oxide. This contact is coupled to bidirectional drive pulse source 16′ (corresponding to the source 16 used in the FIG. 1 embodiment). The novel third contact, which is used for signal extraction, takes the form of a square or circular band encircling the contact 54. The third contact consists of an N+ region 56 diffused into the upper surface of the semiconductor, a metallization covering the region 56, and a bonded lead 58 applied to the metallization 57. Electrical signal readout is derived from a switch 19′ and capacitor 18′ coupled to contacts 52 and 58 and operating in the same manner as illustrated in FIG. 1. The arrangement of FIG. 6 permits the sensors to be arranged in close proximity to one another without interference between adjacent cells.

Figure 7:
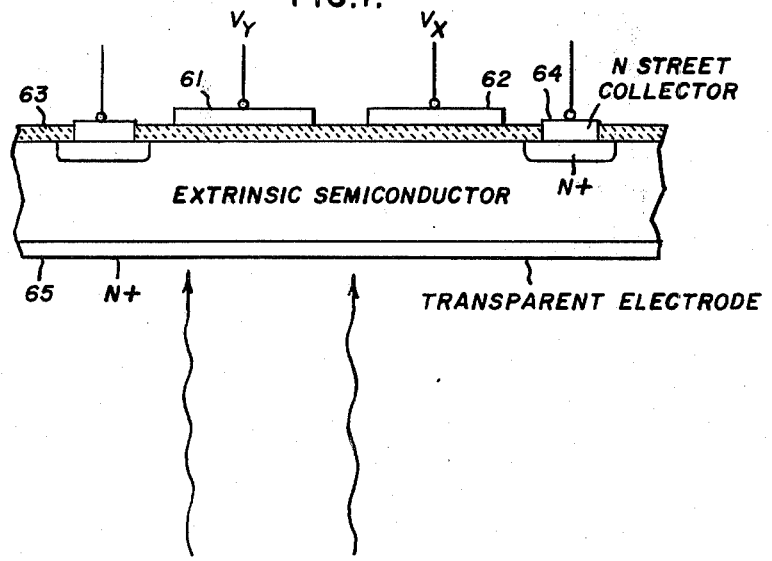
FIG. 7 illustrates a third embodiment in which the IR sensor is a cell in an area array, having two insulated contacts for x and y cell address, and an additional peripheral contact for charge injection.

A third arrangement of the invention suitable for use in area arrays is shown in FIG. 7. In this configuration, a pair of insulating contacts 61 and 62 are provided over the oxide layer 63, while a "N street" collector, which is in the form of a rectangular grid surrounds each cell. The "N street" collector is normally at near ground potential, collecting injected electrons and preventing interaction between adjacent cells in the array. The undersurface of the sensor is provided with an N+ doped transparent electrode 65 through which IR radiation passes into the sensor. In this particular configuration, the readout is provided by suitable energization of the electrodes $V_y$ and $V_x$. In particular, at a particular start time all electrodes 61, 62 in the array are at a positive potential so as to accumulate IR induced charges. In interrogating the cell, the potential on 62 ($V_x$) is allowed to drop to zero forcing all the accumulated electrons in the cell to collect under 61 which remains positive. A moment later the contact 61 is given a negative injection potential, injecting the stored electrons into the surroundingg collector 64.

With the invention has been described in connection with a substrate of N type semiconductor material, it should be evident that it can also be employed with P type material. While in N type material the majority carriers are electrons, the majority carriers would be "holes" in P type material. In that case, the transparent contact layer would be of P+ material, and the polarities of the applied drive pulse and the read-out currents would be reversed to those of the present embodiment.

While the under electrode (opposite the insulating contact) has been made transparent to permit IR penetration into the substrate, the upper contact may be IR transparent instead. The illustrated arrangement is normally preferred since conduction runs on the top surface reduce the percentage of semiconductor area that may enter into the radiation interaction.

The dopants selected and amounts used, the voltage and the optimum temperature will depend upon the application. For high quantum efficiency, the devices should satisfy the following relation:

$$\alpha d > 1$$

where $d$ is the thickness of the IR sensing region, $\alpha$ is the reciprocal of the photon mean free path, which is in turn defined to be $$\alpha = N_i \sigma_a$$

where $N_i$ is the un-ionized impurity concentration, and $\sigma_a$ = photon capture cross section. As previously indicated, $N_i$ is temperature dependent. The temperature must be selected to be low enough to avoid ionizing the dopant centers. In particular:

$$kT < < E_i$$

where $E_i$ = ionization energy of the dopant,
T = temperature
k = Boltzmann constant.

What is claimd as new and desired to be secured by Letters Patent of the United States is:

1. An infrared radiation sensor comprising:
   a. a semiconductor substrate of doped semiconductor material upon which IR illumination impinges creating mobile majority carriers and immobile sites of opposite charge,
   b. a thin insulating layer applied to one surface of said substrate,
   c. a first electrical contact applied to said insulating layer,
   d. a second electrical contact to said substrate,
   e. cryogenic means for establishing said semiconductor at a temperature providing inadequate thermal energy to ionize the dopant centers, and
   f. a source of bidirectional pulses coupled to said contacts having a first polarity for accumulating said mobile photon induced majority carriers at the oxide-semiconductor interface and a reverse polarity for injecting charges stored at the oxide-semiconductor interface into said second electrical contact.

2. The combination set forth in claim 1 wherein said semiconductor material is N type, and said majority carriers are electrons.

3. The combination as set forth in claim 2, wherein said second contact is applied to the surface of said substrate opposite said first contact, and is transparent to permit the entrance of IR illumination into said substrate.

4. The combination as set forth in claim 3, having in addition thereto a third contact, in ohmic contact with said substrate and applied to the same surface of said substrate as said first contact to which accumulated charges are injected for IR sensing.

5. The combination as set forth in claim 4 for use as a cell in an array of like cells wherein said third contact bounds said second contact to preclude interaction between adjacent cells.

6. The combination as set forth in claim 5 for use as a cell in an area array of like cells, and wherein said first electrical contact on said insulating layer is associated with row selection of the cell and having in addition thereto a second electrical contact on said insulating layer associated with column selection of the cell.

* * * * *